United States Patent
Pan

(10) Patent No.: US 8,970,273 B2
(45) Date of Patent: Mar. 3, 2015

(54) PHASE OFFSET CANCELLATION CIRCUIT AND ASSOCIATED CLOCK GENERATOR

(71) Applicants: Global Unichip Corporation, Hsinchu (TW); Taiwan Semiconductor Manufacturing Co., Ltd., Hsin-Chu (TW)

(72) Inventor: Chen-Yang Pan, Taipei (TW)

(73) Assignees: Global Unichip Corporation, Hsinchu (TW); Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/092,386

(22) Filed: Nov. 27, 2013

(65) Prior Publication Data

US 2014/0152364 A1 Jun. 5, 2014

(30) Foreign Application Priority Data

Nov. 30, 2012 (TW) ................................ 101144920 A

(51) Int. Cl.
*H03H 11/16* (2006.01)
*H03H 11/20* (2006.01)

(52) U.S. Cl.
CPC .................................... *H03H 11/20* (2013.01)
USPC ............................................. 327/238; 327/254

(58) Field of Classification Search
None
See application file for complete search history.

(56) References Cited

U.S. PATENT DOCUMENTS

| | | | |
|---|---|---|---|
| 6,380,774 B2 * | 4/2002 | Saeki | 327/119 |
| 7,724,097 B2 | 5/2010 | Carley et al. | |
| 7,825,712 B2 * | 11/2010 | Yoon | 327/237 |
| 8,169,247 B2 * | 5/2012 | Nedachi | 327/231 |
| 8,427,217 B1 * | 4/2013 | Le Grand de Mercey et al. | 327/231 |
| 2009/0202027 A1 * | 8/2009 | Yin et al. | 375/355 |
| 2010/0052797 A1 | 3/2010 | Carley et al. | |
| 2011/0129041 A1 | 6/2011 | Ishihara et al. | |

FOREIGN PATENT DOCUMENTS

TW I289973 11/2007

* cited by examiner

*Primary Examiner* — Cassandra Cox
(74) *Attorney, Agent, or Firm* — WPAT, PC; Justin King

(57) ABSTRACT

Phase offset cancellation circuit and associated clock generator, include a first modifying phase interpolator and a second modifying phase interpolator, and provide a first modified clock and a second modified clock according to a first to a fourth input clocks; wherein the first and the third clocks are of opposite phases. The first modifying phase interpolator performs equal phase interpolation between the first and the second input clocks to generate the first modified clock, and the second modifying phase interpolator performs equal phase interpolation between the third and the fourth input clocks to generate the second modified clock, such that a phase difference between the first modified clock and the second modified clock is of substantially 90 degrees, against phase offsets between the first to the fourth input clocks.

9 Claims, 5 Drawing Sheets

US 8,970,273 B2

PHASE OFFSET CANCELLATION CIRCUIT AND ASSOCIATED CLOCK GENERATOR

This application claims the benefit of Taiwan Patent Application No. 101144920, filed Nov. 30, 2012, the subject matter of which is incorporated herein by reference.

FIELD OF THE INVENTION

The present invention relates to a phase offset cancellation circuit and associated clock generator, and more particularly, to a phase offset cancellation circuit and associated clock generator capable of providing output clocks of accurate quadrature phase relation from input clocks suffering phase offset of inaccurate quadrature phase relation.

BACKGROUND OF THE INVENTION

Providing clocks of accurate and well-defined phases is one of the essential requirements for correct operation of various kinds of sequential circuits. For instance, an interface circuit handling signal input/output is one of the most important sequential circuits of modern integrated circuits. As an example, consider a chip (die) which needs to receive an incoming serial signal; an interface circuit of the chip will include a clock data recovery (CDR) circuit for retrieving clock embedded in the serial signal and accordingly sampling the serial signal to obtain bit data serially arranged in the serial signal. Please refer to FIG. 1 illustrating a CDR operated by half-rate sampling.

As shown in FIG. 1, for latching a serial signal Din, half-rate sampling utilizes four clocks CK0, CK90, CK180 and CK270 of equal frequency (period) and quadrature phases (phase different by a quarter of a period). The serial signal Din includes a plurality of serially arranged unit data (e.g., bit data), such as the unit data D1 and D2; each unit data lasts for a duration UI. The period T of the four clocks CK0 to CK270 is double of the duration UI, i.e., T=2*UI. Therefore, if edges (e.g., rising edges) of the clocks CK90 and CK270 are tuned to align transitions between the serially arranged unit data, then edges (e.g., rising edges) of the clocks CK0 and CK180 will locate at centers of the unit data for optimal sampling of digital contents of each unit data.

By illustration of FIG. 1, providing high quality clocks of accurate quadrature phases is one of the essential keys for correct half-rate sampling; the phase differences between the clocks CK0, CK90, CK180 and CK270 should closely approach or equal 90 degrees to achieve successful CDR. If the mutual phase differences between the clocks CK0, CK90, CK180 and CK270 deviate from ideal 90 degrees, correctness of CDR is jeopardized.

Please refer to FIG. 2 illustrating a prior art clock generation for providing clocks PI0, PQ0, PI180 and PQ180 as the clocks CK0, CK90, CK180 and CK270 shown in FIG. 1. The prior art shown in FIG. 2 utilizes two phase interpolators 10a and 10b, each phase interpolator has four clock input terminals in0, in90, in180 and in270, as well as a weighting input terminal code_in; each phase interpolator receives a variable weighting a0 from the weighting input terminal code_in, and performs phase interpolation between clocks received from the clock input terminals in0 to in270 based on the weighting a0 to generate two output clocks of opposite phases. The phase interpolator 10a has its input terminals in0, in90, in180 and in270 respectively coupled to four input clocks S0, S90, S180 and S270 to generate two output clocks PI0 and PI180 of opposite phases (a phase difference of 180 degrees), such that phase of the clock PI0 can be expressed by (a0*PH+(1-a0)*PH90); wherein phases PH0 and PH90 are the respective phases of the clocks S0 and S90, and the weighting a0 is between 0 and 1. On the other hand, the phase interpolator 10b has its input terminals in0, in90, in180 and in270 respectively coupled to the input clocks S270, S0, S90 and S180 to generate two output clocks PQ0 and PQ180 of opposite phases, and a phase of the clock PQ0 can be expressed by (a0*PH90+(1-a0)*PH180); where phase PH180 is phase of the clock S180.

For the prior art shown in FIG. 2, an ideal phase difference (PH90-PH0) between the clocks S0 and S90 is 90 degrees, and an ideal phase difference (PH180-PH90) between the clocks S90 and S180 is also 90 degrees; under such ideal scenario, a phase difference between the clocks PI0 and PQ0 can be calculated as: {a0*PH90+(1-a0)*PH180}-{a0*PH0+(1-a0)*PH90}=a0*(PH90-PH))+(1-a0)*(PH180-PH90) =90. That is, if the phase differences between the input clocks S0, S90 and S180 equal 90 degrees, the phase difference between the clocks PI0 and PQ0 will also be kept at 90 degrees; by tuning value of the weighting a0 to align the clocks PI0 and PQ0 with transitions between unit data of a serial signal, CDR can be accomplished by the clocks PI0, PQ0, PI180 and PQ180.

However, because the clocks S0 to S270 are transmitted to phase interpolators by clock tree, many non-ideal factors (e.g., noise and mismatch between clock transmission paths and related elements, etc.) affect phase differences between the clocks S0 to S270; although the clocks S0 and S180 can be kept at 180-degree opposite phases by cross-couple pairing, the phase difference (PH90-PH0) between the clocks S0 and S90 deviates from ideal 90 degrees to be expressed by (PH90-PH0)=(90+PHoff); wherein PHoff is a phase offset. Consequently, the phase difference between the clocks S90 and S180 is expressed by (PH180-PH90)=(90-PHoff). After phase interpolation, the phase difference between the clocks PI0 and PQ0 therefore also deviates from 90 degrees; the deviation is proportional to the phase offset PHoff. Since the phase difference between the clocks PI0 and PQ0 violates ideal quadrature phase relation of 90 degrees, the prior art fails to correctly perform CDR.

SUMMARY OF THE INVENTION

To address issues of prior art and provide clocks of accurate phase differences, an objective of the invention involves a phase offset cancellation circuit for providing a first modified clock, a second modified clock, a third modified clock and a fourth modified clock according to a first input clock, a second input clock, a third input clock and a fourth input clock. In an embodiment, the first input clock and the third input clock are of opposite phases, a phase of the second input clock is between phases of the first input clock and the third input clock. The third modified clock and the first modified clock are of opposite phases, the fourth modified clock and the second modified clock are of opposite phases.

The phase offset cancellation circuit of the invention includes a first modifying phase interpolator and a second modifying phase interpolator. The first modifying phase interpolator is coupled to the first input clock and the second input clock for performing equal phase interpolation between the first input clock and the second input clock to generate the first modified clock and the third modified clock; the second modifying phase interpolator is coupled to the second input clock and the third input clock for performing equal phase interpolation between the second input clock and the third input clock to generate the second modified clock and the fourth modified clock.

For example, if a phase difference (PH90−PH0) between the first input clock and the second input clock deviates from 90 degrees to be expressed by (PH90−PH0)=(90+PHoff), then a phase difference (PH180−PH90) between the second input clock and the third input clock also deviates from 90 degrees and becomes (PH180−PH90)=(90−PHoff); because of equal phase interpolation, a phase of the first modified clock can be calculated as (90+PHoff)/2=(45+PHoff/2); similarly, a phase of the second modified clock is (180+(90+PHoff))/2=(135+PHoff/2) owing to equal phase interpolation. Hence, a phase difference between the first modified clock and the second modified clock will substantially equal 90 degrees, since the phase difference between the first modified clock and the second modified clock can be calculated by (135+PHoff/2)−(45+PHoff/2)=90. In other words, despite that the phase difference between the first input clock and the second input clock deviates from ideal 90 degrees, the phase offset cancellation circuit of the invention is capable of providing the first modified clock and the second modified clock which possess accurate quadrature phase relation.

An objective of the invention involves a clock generator for providing a first output clock, a second output clock, a third output clock and a fourth output clock according to a first input clock, a second input clock, a third input clock, a fourth input clock and a variable weighting. The clock generator includes a first modifying phase interpolator, a second modifying phase interpolator, a first adjustable phase interpolator and a second adjustable phase interpolator. The first modifying phase interpolator is coupled to the first input clock and the second input clock for performing phase interpolation between the first input clock and the second input clock based on a predetermined weighting (e.g., an equal weighting) to generate a first modified clock and a third modified clock whose phase is opposite to phase of the first modified clock. The second modifying phase interpolator is coupled to the second input clock and the third input clock for performing phase interpolation between the second input clock and the third input clock based on the predetermined weighting to generate a second modified clock and a fourth modified clock whose phase is opposite to phase of the second modified clock.

The first adjustable phase interpolator is coupled to the first modified clock and the second modified clock for performing phase interpolation between the first modified clock and the second modified clock based on the variable weighting to generate the first output clock and the third output clock of opposite phases. The second adjustable phase interpolator is coupled to the second modified clock and the third modified clock for performing phase interpolation between the second modified clock and the third modified clock based on the variable weighting to generate the second output clock and the fourth output clock of opposite phases. Because the first to the fourth modified clocks can cancel phase offsets which corrupt quadrature phase relation between the first to the fourth input clocks, the first to the fourth output clocks therefore benefit from high accurate quadrature phase relation, and can be adopted for CDR of high correctness and/or other applications which demand clocks of accurate phases.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 3:
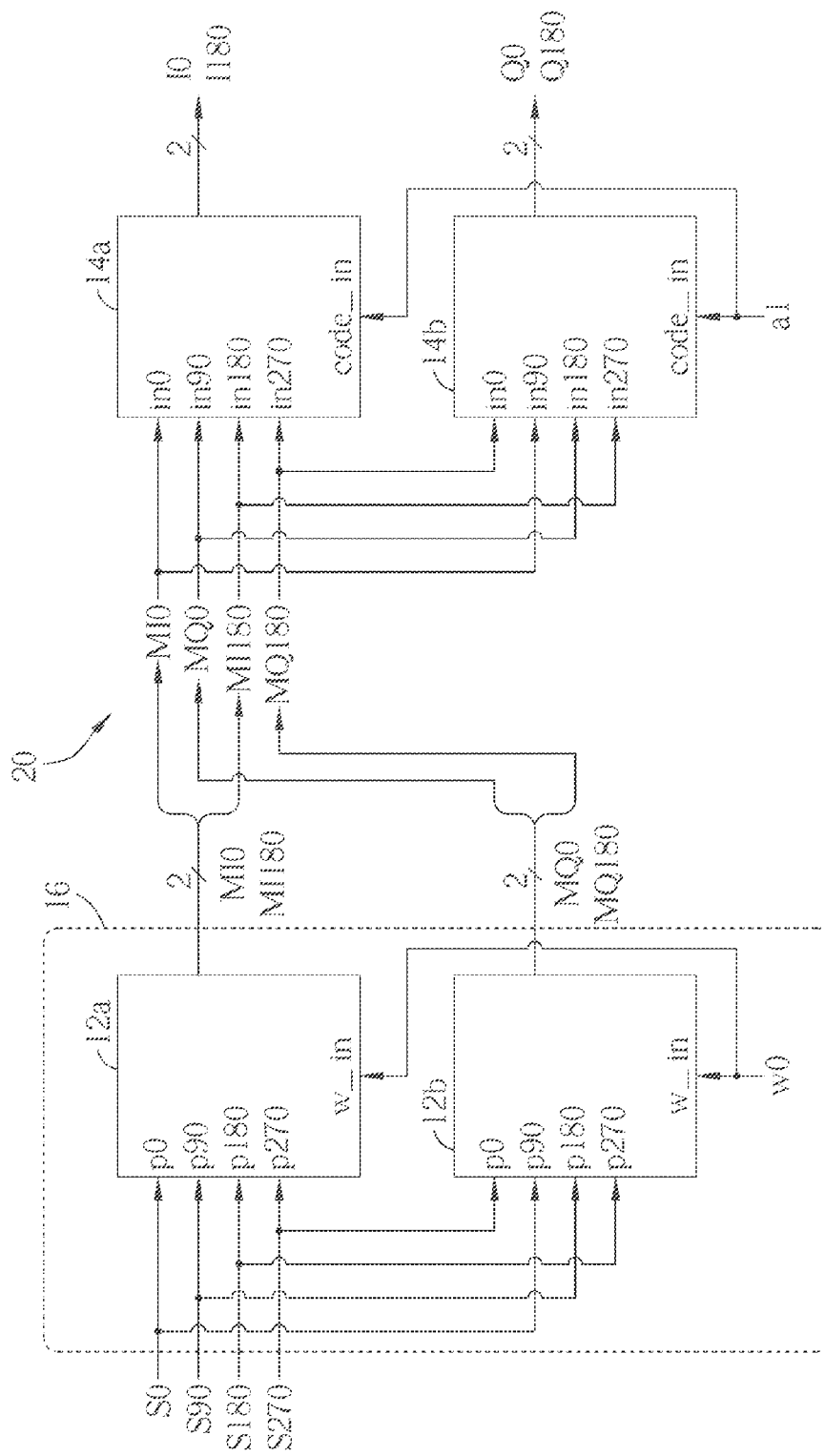
FIG. 3 illustrates a clock generator and a phase offset cancellation circuit according to an embodiment of the invention.

Please refer to FIG. 3 illustrating a clock generator 20 according to an embodiment of the invention, which is capable of providing four clocks I0, Q0, I180 and Q180 of a same frequency as output clocks according to a variable weighting a1 and four clocks (input clocks) S0, S90, S180 and S270 of a same frequency, such that phase differences between the output clocks (I0, Q0, I180, Q180) and the input clocks (S0 to S270) can be controlled by the weighting a1, and mutual phase differences between the clocks I0, Q0, I180 and Q180 can be kept fixed.

The clock generator 20 includes four phase interpolators 12a, 12b, 14a and 14b. The phase interpolators 12a and 12b work as modifying phase interpolators to form a phase offset cancellation circuit 16; structures of the phase interpolators 12a and 12b can be identical, each has clock input terminals p0, p90, p180 and p270, and can also include a weighting input terminal w_in for receiving a weighting w0. The input terminals p0, p90, p180 and p270 of the phase interpolator 12a are respectively coupled to the clocks S0, S90, S180 and S270, and the input terminals p0, p90, p180 and p270 of the phase interpolator 12b are respectively coupled to the clocks S270, S0, S90 and S180. The phase interpolator 12a performs phase interpolation between the clocks S0 to S270 base one the weighting w0 to generate two clocks MI0 and MI180 as two modified clocks. In an embodiment, the phase interpolator 12a performs equal phase interpolation between the clocks S0 and S90 to generate the clock MI0; that is, the weighting w0 can be a predetermined weighting with a value fixed to ½, such that phase of the clock MI0 equals an average of the phases of the clocks S0 and S90. The clock MI180 can be 180-degree out of phase with the clock MI0.

The phase interpolator 12b performs phase interpolation between the clocks S0 to S270 also base on the weighting w0, and accordingly generates two clocks MQ0 and MQ180 as two modified clocks. In an embodiment, the phase interpolator 12b performs equal phase interpolation between the clocks S90 and S180 to generate the clock MQ0, phase of the clock MQ0 can thus equals an averaged phase of the clocks S90 and S180. The clock MQ180 can be 180-degree out of phase with the clock MQ0.

The phase interpolators 14a and 14b function as two adjustable phase interpolators; they can share a same structure, each of them has clock input terminals in0, in90, in180 and in270, as well as a weighting input terminal code_in for receiving the weighting a1. The input terminals in0, in90, in180 and in270 of the phase interpolator 14a are respectively coupled to the clocks MI0, MQ0, MI180 and MQ180, and the input terminals in0, in90, in180 and in270 of the phase interpolator 14b are respectively coupled to the clocks MQ180, MI0, MQ0 and MI180. The phase interpolator 14a performs phase interpolation between the clocks MI0, MQ0, MI180 and MQ180 based on the weighting a1 to generate the clocks I0 and I180. For example, phase of the clock I0 can be between MI0 and MQ0, and be controlled by the adjustable (variable/programmable) weighting a1; when the weighting a1 approaches 0, phase of the clock I0 approaches phase of the clock MI0, and when the weighting a1 is adjusted toward 1, phase of the clock I0 accordingly changes toward phase of the clock MQ0. The clock I180 can be 180-degree out of phase with the clock I0.

In an embodiment, the weighting a1 can be encoded to a value of 6 binary bits; when the value equals binary 000000, phase of the clock I0 equals phase of the clock MI0. As value of the weighting a1 increases, phase of the clock I0 changes toward phase of the clock MQ0. When the weighting a1 equals binary 001000, the phase interpolator 14a performs equal phase interpolation between the clock MI0 and MQ0, hence phase of the clock I0 equals an average of phases of the clocks MI0 and MQ0. When the weighting a1 becomes binary 010000, phase of the clock I0 becomes equal to phase of the clock MQ0.

Similar to the phase interpolator 14a, the phase interpolator 14b performs phase interpolation between the clocks MI0, MQ0, MI180 and MQ180 based on the weighting a1 to generate the clocks Q0 and Q180; the clock Q180 can be 180-degree out of phase with the clock Q0. For example, phase of the clock Q0 can be between phases of the clocks MQ0 and MI180, and be controlled by the variable weighting a1; when the weighting a1 is close to 0, phase of the clock Q0 becomes close to phase of the clock MQ0, and when the weighting a1 approaches 1, phase of the clock Q0 correspondingly approaches phase of the clock MI180.

Figure 1:
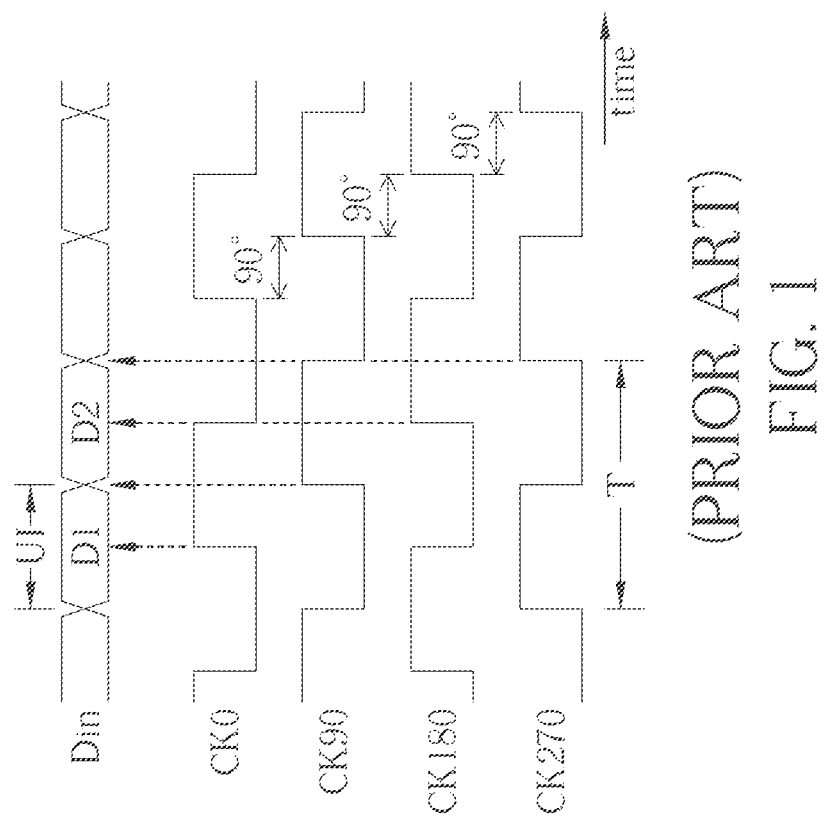
FIG. 1 (prior art) illustrates an embodiment of CDR.
Figure 2:
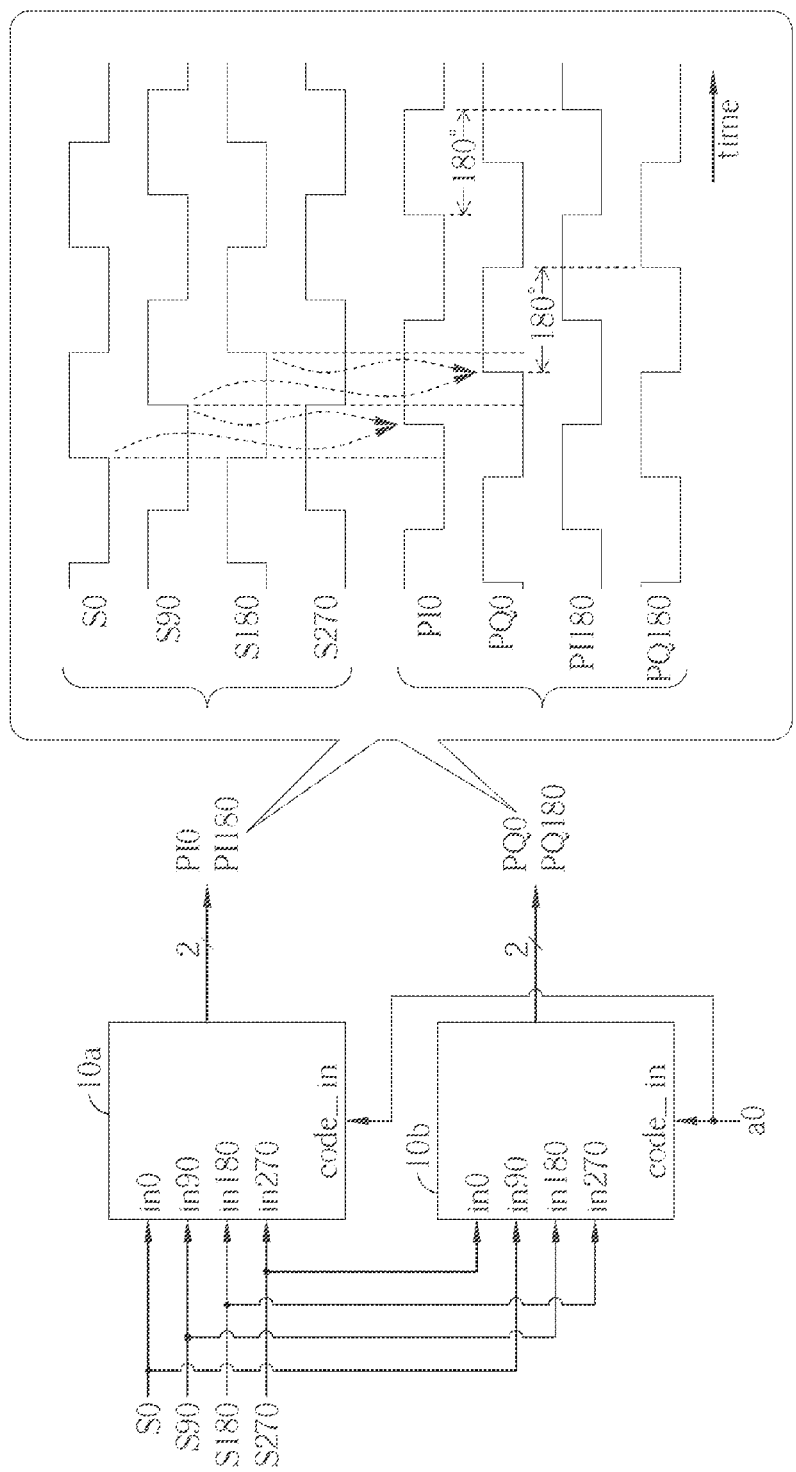
FIG. 2 (prior art) illustrates a prior art for generating clocks of quadrature phase relation.

One of the functions of the clock generator 20 is keeping accurate quadrature phase relation between the clocks I0, Q0, I180 and Q180, so they can be adopted for applications demanding clocks of accurate quadrature phase relation, such as CDR of half-rate sampling shown in FIG. 1. However, if the source clocks S0 to S270 suffer from phase offset of non-ideal quadrature phase relation, then accurate quadrature phase relation between the clocks I0, Q0, I180 and Q180 can not be achieved by directly performing phase interpolation between these non-ideal clocks S0 to S270.

In FIG. 3, the two phase interpolators 12a and 12b of the phase offset cancellation circuit 16 are employed to cancel phase offset between the clocks S0 to S270, so the clocks MI0, MQ0, MI180 and MQ180 possess high accurate quadrature phase relation; that is, phase difference between the clocks MQ0 and MI0 is equal to or highly close to 90 degrees. As a result, the clocks I0, Q0, I180 and Q180 provided by phase interpolation between the clocks MI0, MQ0, MI180 and MQ180 will also possess high accurate quadrature phase relation. Please refer to FIG. 4 and FIG. 5 illustrating phase offset cancellation of the invention respectively by phases and timing of related clocks.

Figure 4:
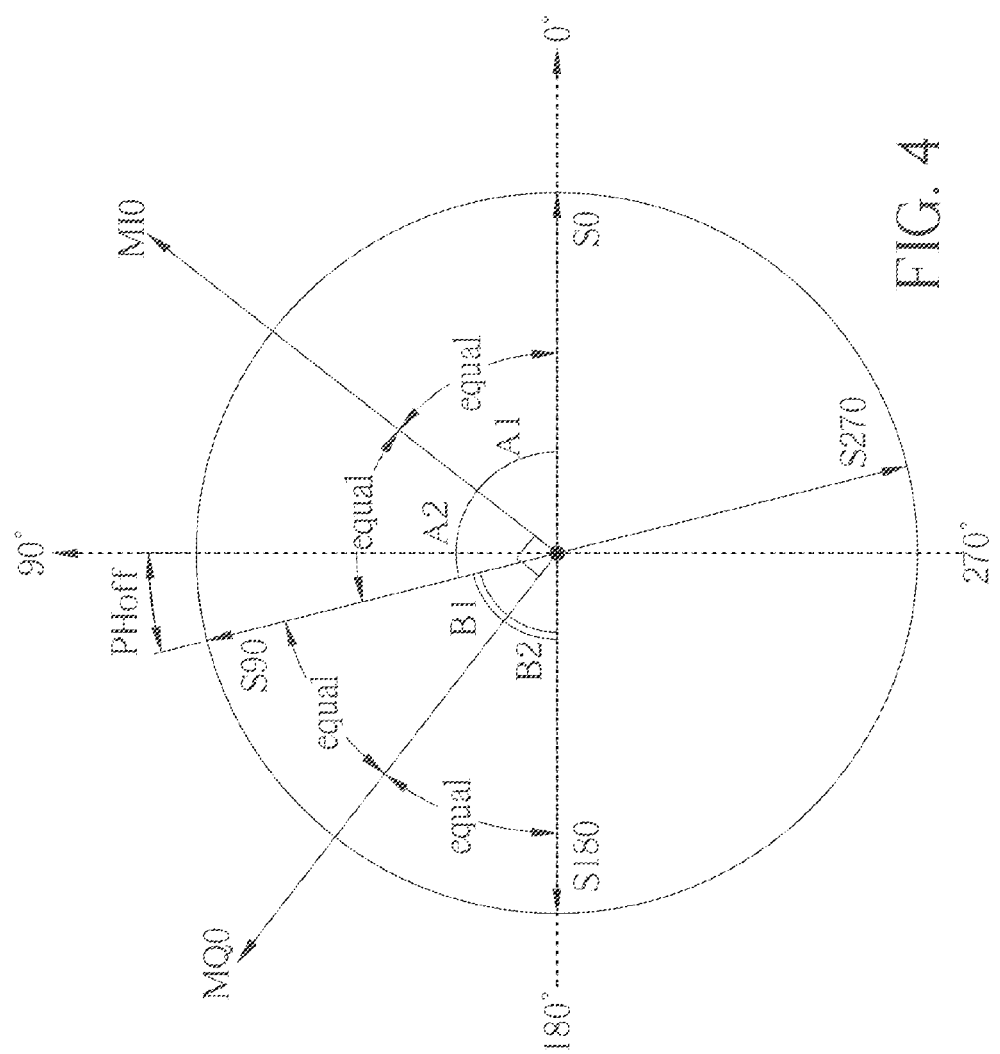
FIG. 4 illustrates phases of related clocks shown in FIG. 3.
Figure 5:
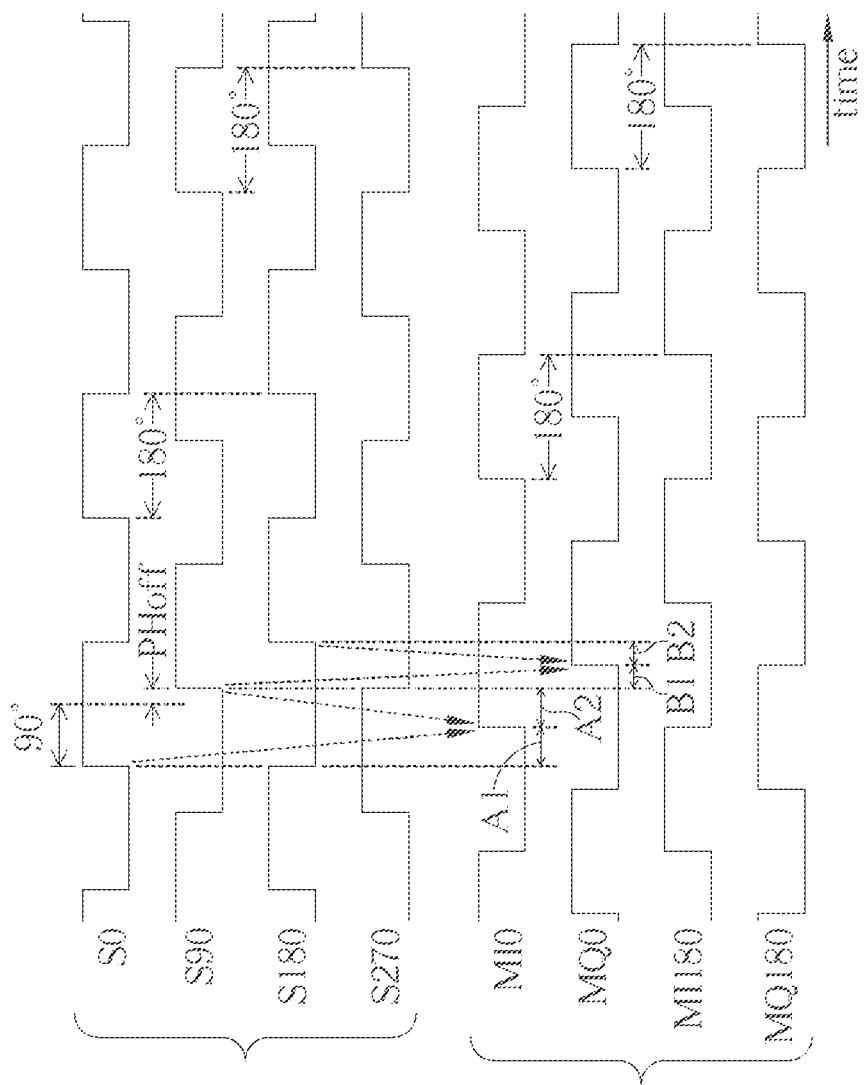
FIG. 5 illustrates waveforms of related clocks shown in FIG. 3.

As shown in FIG. 4 and FIG. 5, phases of the clocks S90 and S0 deviate from ideal 90-degree quadrature phase relation by an extra phase offset PHoff, and phases of the clocks S180 and S0 are kept at 180-degree opposite phases. Because the phase interpolator 12a is arranged to perform equal phase interpolation between the clocks S0 and S90 to generate the clock MI0, a phase difference A1 between the clocks MI0 and S0 is equal to a phase difference A2 between the clocks S90 and MI0. That is, phase of the clock MI0 is an angular bisector between phases of the clocks S0 and S90, as shown in FIG. 4. Similarly, since the phase interpolator 12b is arranged to perform equal phase interpolation between the clocks S90 and S180 to generate the clock MQ0, a phase difference B1 between the clocks MQ0 and S90 is equal to a phase difference B2 between the clocks S180 and MQ0; i.e., phase of the clock MQ0 becomes an angular bisector between phases of the clocks S90 and S180. Because the clocks S0 and S180 are kept at 180-degree phase difference, the clocks MI0 and MQ0 will be kept at a 90-degree phase difference independent of the phase offset PHoff. In other words, since the phase differences (A1+A2+B1+B2)=180 and A1=A2, B1=B2, hence (A2+B1)=90 to maintain 90-degree quadrature phase relation between the clocks MI0 and MQ0, no matter what value the phase offset PHoff is.

In brief, according to the invention, the phase interpolators 12a and 12b first perform equal phase interpolation between the clocks S0 to S270 of non-ideal quadrature phase relation to generate the clocks MI0, MQ0, MI180 and MQ180 of correct quadrature phase relation, so the phase interpolators 14a and 14b can perform phase interpolation between the clocks MI0, MQ0, MI180 and MQ180 based on variable weighting to generate the clocks I0, Q0, I180 and Q180 of adjustable phases and accurate quadrature phase relation. The clocks I0, Q0, I180 and Q180 can then be applied to applications which need phase-adjustable quadrature clocks, e.g., be utilized as the clocks CK0, CK90, CK180 and CK270 in CDR shown in FIG. 1.

Because the phase interpolators 12a and 12b only need to perform phase interpolation of fixed equal weighting, structures of the phase interpolators 12a and 12b can be further simplified. For example, a fully adjustable (programmable) phase interpolator, such as the interpolator 14a or 14b, requires a decoder to decode the binary variable weighting a1. In contrast, the phase interpolators 12a and 12b do not need decoder since their weighting w0 is a predetermined constant equivalent to ½. The weighting w0 can be built into the phase interpolators 12a and 12b, so the phase interpolators 12a and 12b can also eliminate the weighting input terminal w_in.

In addition, because the phase interpolators 12a and 12b are arranged to perform phase interpolation of equal weighting, influence due to non-linearity of phase interpolation is suppressed. Non-linearity of phase interpolation refers to: phase changes owing to an identical weighting change vary at different values of the weighting. In other words, when the weighting equal to w, assuming a weighting change dw causes a phase change dPH in the interpolated phase, then non-linearity causes dPH/dw to vary as the weighting w varies. When the weighting w is close to 0 or 1, impact of non-linearity is severer; for an equal weighting w (w=½), however, non-linearity affects much less. As the phase interpolators 12a and 12b are set to perform phase interpolation of equal weighting, they are less sensitive to non-linearity. Furthermore, to address the issue of non-linearity, a fully adjustable phase interpolator is equipped with circuitry for compensation or correction; on the contrary, the phase interpolators 12a and 12b can work without such mechanism designed for correcting non-linearity, and structures of the phase interpolators 12a and 12b can therefore be further simplified.

To sum up, comparing to the prior art, the invention provides a robust solution for quadrature clocks, capable of generating modified clocks and output clocks of accurate quadrature phase relation from input clocks of offset and non-ideal quadrature phase relation. Because the invention is based on phase interpolation, it can be generally applied to applications of various frequencies; for example, since high-speed adjustable phase interpolators have been utilized in high-speed CDR, inclusion of high-speed modifying phase interpolators for equal phase interpolation is highly feasible. Despite that input clocks are vulnerable to non-ideal factors such as transmission distance, manufacturing process, supply voltage and temperature, quadrature clocks generated according to the invention are contrarily less sensitive to these non-ideal factors.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A phase offset cancellation circuit for providing a first modified clock and a second modified clock according to a first input clock, a second input clock and a third input clock, comprising:

a first modifying phase interpolator coupled to the first input clock and the second input clock for performing equal phase interpolation between the first input clock and the second input clock based on a fixed constant weighting, so as to generate the first modified clock; and a second modifying phase interpolator coupled to the second input clock and the third input clock for performing equal phase interpolation between the second input clock and the third input clock based on the fixed constant weighting, so as to generate the second modified clock;

wherein the first input clock and the third input clock are of opposite phases.

2. The phase offset cancellation circuit of claim 1, wherein a phase of the second input clock is between phases of the first input clock and the third input clock.

3. The phase offset cancellation circuit of claim 1, wherein the first modifying phase interpolator is further arranged to generate a third modified clock whose phase is opposite to a phase of the first modified clock, and the second modifying phase interpolator is further arranged to generate a fourth modified clock whose phase is opposite to a phase of the second modified clock.

4. A clock generator for providing a first output clock according to a first input clock, a second input clock, a third input clock and a variable weighting, comprising:

a first modifying phase interpolator coupled to the first input clock and the second input clock for performing phase interpolation between the first input clock and the second input clock based on a predetermined weighting to generate a first modified clock;

a second modifying phase interpolator coupled to the second input clock and the third input clock for performing phase interpolation between the second input clock and the third input clock based on the predetermined weighting to generate a second modified clock; and a first adjustable phase interpolator coupled to the first modified clock and the second modified clock for performing phase interpolation between the first modified clock and the second modified clock based on the variable weighting to generate the first output clock.

5. The clock generator of claim 4, wherein the first input clock and the third input clock are of opposite phases.

6. The clock generator of claim 4, wherein the predetermined weighting is arranged to cause the first modifying phase interpolator to perform equal phase interpolation between the first input clock and the second input clock to generate the first modified clock, and the predetermined weighting is arranged to cause the second modifying phase interpolator to perform equal phase interpolation between the second input clock and the third input clock to generate the second modified clock.

7. The clock generator of claim 4, wherein the first modifying phase interpolator is further arranged to generate a third modified clock whose phase is opposite to a phase of the first modified clock, and the second modifying phase interpolator is further arranged to generate a fourth modified clock whose phase is opposite to a phase of the second modified clock.

8. The clock generator of claim 7 further arranged to provide a second output clock according to the first input clock, the second input clock, the third input clock and the variable weighting, and further comprising:

a second adjustable phase interpolator coupled to the second modified clock and the third modified clock for performing phase interpolation between the second modified clock and the third modified clock based on the variable weighting to generate the second output clock.

9. The clock generator of claim 8 further arranged to provide a third output clock and a fourth output clock according to the first input clock, the second input clock, the third input clock and the variable weighting; wherein the first adjustable phase interpolator is further arranged to generate the third output clock whose phase is opposite to a phase of the first output clock, and the second adjustable phase interpolator is further arranged to generate the fourth output clock whose phase is opposite to a phase of the second output clock.

* * * * *